(12) United States Patent
Cusinato et al.

(10) Patent No.: US 9,337,780 B2
(45) Date of Patent: May 10, 2016

(54) AMPLIFIER WITH SAMPLE AND HOLD OUTPUT AND LOW DRIVE STAGE

(75) Inventors: Paolo Cusinato, Villeneuve Loubet (FR); Christian Sorace, Antibes (FR); Frederic Kubelec, Antibes (FR)

(73) Assignee: Texas Instruments Incorporated, Dallas, TX (US)

( * ) Notice: Subject to any disclaimer, the term of this patent is extended or adjusted under 35 U.S.C. 154(b) by 3263 days.

(21) Appl. No.: 11/175,785

(22) Filed: Jul. 5, 2005

(65) Prior Publication Data

US 2006/0182266 A1   Aug. 17, 2006

(30) Foreign Application Priority Data

Feb. 3, 2005 (EP) .................................... 05290246

(51) Int. Cl.
*H04B 15/00* (2006.01)
*H03F 1/30* (2006.01)

(52) U.S. Cl.
CPC ....................................... *H03F 1/305* (2013.01)

(58) Field of Classification Search
CPC ......... H04R 19/04; H04R 3/002; H03M 1/00; H03M 2201/01; H03M 2201/3105; H03M 2201/3178; H03M 2201/4135; H03M 2201/4212; H03M 2201/4233; H03M 2201/425; H03M 2201/4279; H03M 2201/8128

USPC .......... 381/77, 106, 104, 94.5, 121, 120, 123, 381/57, 55; 330/51, 251, 254, 125 R, 69; 379/395, 395.01, 390.01

See application file for complete search history.

(56) References Cited

U.S. PATENT DOCUMENTS

| | | | | |
|---|---|---|---|---|
| 3,733,955 | A * | 5/1973 | Reinagel et al. | 84/678 |
| 4,232,192 | A * | 11/1980 | Beex | 381/83 |
| 4,546,324 | A * | 10/1985 | Bingham et al. | 330/9 |
| 5,642,076 | A | 6/1997 | Naokawa et al. | |
| 5,648,742 | A * | 7/1997 | Ghaffaripour et al. | 330/51 |
| 6,538,590 | B1 * | 3/2003 | Gaboriau et al. | 341/152 |
| 6,573,787 | B2 * | 6/2003 | Ikin | 330/51 |
| 2004/0246049 | A1 * | 12/2004 | Itakura et al. | 330/69 |
| 2005/0025322 | A1 * | 2/2005 | Henson et al. | 381/120 |
| 2005/0084120 | A1 * | 4/2005 | Hagino | 381/120 |
| 2005/0140432 | A1 * | 6/2005 | Nair et al. | 330/9 |
| 2005/0152561 | A1 * | 7/2005 | Spencer | 381/77 |
| 2006/0182265 | A1 * | 8/2006 | Sorace et al. | 379/395 |

FOREIGN PATENT DOCUMENTS

| | | |
|---|---|---|
| EP | 1 229 639 A | 7/2002 |
| WO | WO 02/15388 A | 2/2002 |

* cited by examiner

*Primary Examiner* — Lun-See Lao
(74) *Attorney, Agent, or Firm* — Lawrence J. Bassuk; Frank D. Cimino

(57) ABSTRACT

An amplifier (50) for voice or audio signals, and particularly for headset applications, uses a low $g_m$ amplifier (54) for initially charging an output node (OUT) at the beginning of a power-on phase. After charging the output node, a main amplifier (56) is enabled to amplify the voice or audio signal. At power-down, a sample-and-hold circuit (58) drives an output transistor to discharge an AC coupling capacitor (20). Thus, spikes at the output node are eliminated and an external filtering capacitor is not needed.

5 Claims, 5 Drawing Sheets

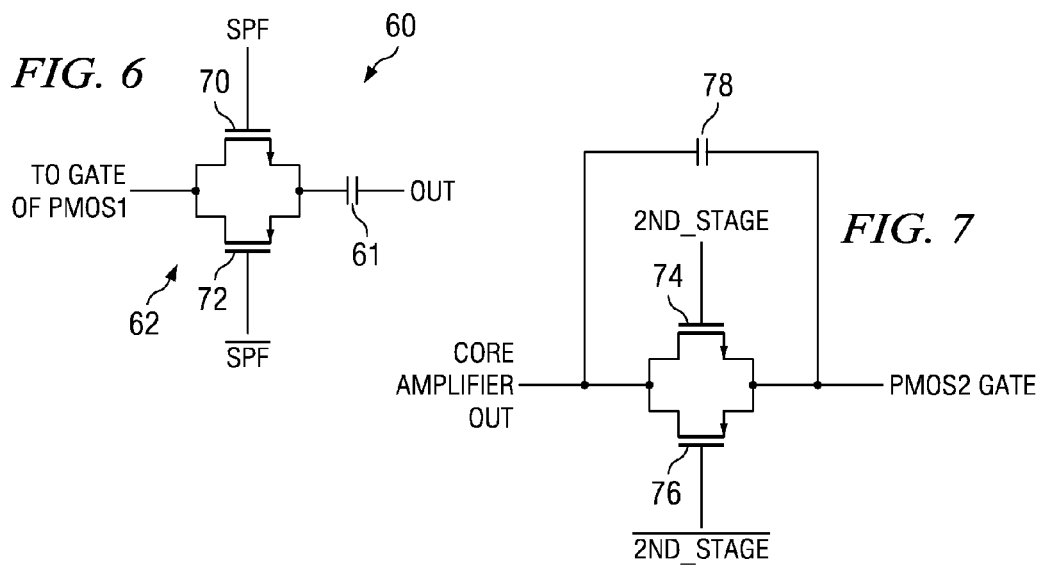
FIG. 6
FIG. 7
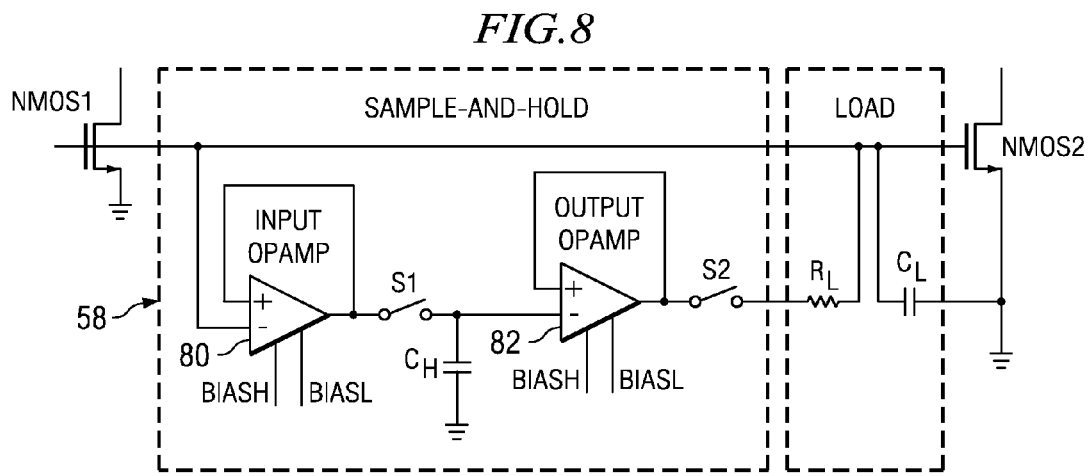
FIG. 8
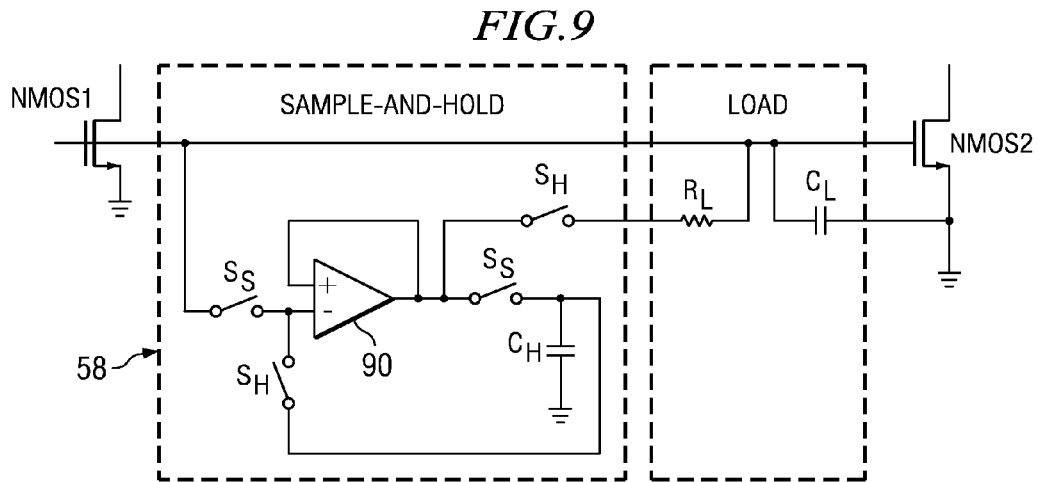
FIG. 9

AMPLIFIER WITH SAMPLE AND HOLD OUTPUT AND LOW DRIVE STAGE

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to audio amplifiers and, more particularly, to a track-and-hold circuit to reduce noise in a headset amplifier.

2. Description of the Related Art

Audio circuitry often suffers from annoying "pop" noises as power is applied to or removed from the audio amplification circuitry. While the popping can be annoying in any application, it is particularly annoying in headset applications, where the speaker is firing directly into the user's ear.

Headsets are becoming more and more popular with mobile processing devices and especially in communications applications, such as with mobile telephones (including devices such as personal digital assistants that may be used as a telephone, either through cellular circuitry or as a voice-over Internet-protocol, or VOIP, device). In conjunction with mobile processing devices, power consumption is an especially important consideration, and power may be frequently switched on and off to the headset amplifier.

FIG. 1a illustrates a general diagram of a receiving (RX) voice channel in a headset amplifier. A DSP (digital signal processor) 10 generates the voice data in digital form. A digital filter 12 receives the digital voice data and passes the filtered data to a DAC (digital-to-analog converter) 14. The output of the DAC 14 (shown here as a differential voltage) is applied to the input of a headset amplifier 16. The output of the headset amplifier 16 is coupled to a speaker 18 through an AC coupling capacitor 20.

FIG. 1b illustrates the state of the art in filtering using an external filtering capacitor 22 to reduce popping noises. In this embodiment, when the headset amplifier transitions from a power-off state to a power-on state, the VMID amplifier 24 (which provides a voltage reference equal to the power supply divided by 2) is powered-on and the headset amplifier output is shorted to VMID using the CHG switch. The settling time of the output OUT is equal to the settling time of VMID, which is dependant on the settling time of the RC-filter ($R_1C_1$). The CHG switch is disabled, and the headset amplifier is then turned on.

For the power-off phase, the headset amplifier is turned off and the DCHG switch shorts the output pin of the output amplifier (OUT) to ground. In this case, the settling time depends on the settling time of the AC-coupling capacitance $C_2$.

This solution has several problems. While the DSP 10, digital filter 12, DAC 14 and headset amplifier are generally formed on a single integrated circuit, the filtering capacitor 22 is an external component on the order of 4.7 µF, which is too large to place on the integrated circuit. Accordingly, a design such as that shown in FIG. 1b requires both an external capacitor and an extra pin from the integrated circuit. Second, the settling time during the power-up, which depends on the $R_1C_1$ filter settling time, can be excessive. Third, the discharge phase is lengthy and may not meet timing constraints in certain applications. The only way to decrease the power down time is to increase the size of DCHG switch (typically a MOS transistor) drastically.

While the cost of the capacitor 22 and extra pin is small for a single device, given the large number of devices generally produced, the overall cost can be significant to the manufacturer.

Accordingly, a need has arisen for a fully integrated solution to eliminate popping noises.

BRIEF SUMMARY OF THE INVENTION

In the present invention, an amplifier provides amplified signals to a speaker through an AC coupling capacitor. Power circuitry selectively applies and removes power to the amplifying circuitry. Discharging circuitry discharges the AC coupling capacitor responsive to a sample-and-hold-circuit when power is removed.

The present invention effectively prevents popping noises due to power-down of the amplifying circuitry using a discharge at a controlled rate.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 1b illustrate a prior art structure for filtering popping noises from the channel of FIG. 1a;

FIG. 5b illustrates a timing diagram showing the operation of the switches of FIG. 5a;

FIG. 5c illustrates a graph of the voltage at the OUT node for the headset amplifier of FIG. 5a;

FIG. 6 illustrates a circuit that can be used as the feedback circuit in the headset amplifier of FIG. 5a;

FIG. 7 illustrates a resistive switch circuit that can be used for selectively coupling the main output stage to the core amplifier;

FIG. 8 illustrates a first embodiment for a sample-and-hold circuit using dual unity gain buffers;

FIG. 9 illustrates a second embodiment for a sample-and-hold circuit using a single unity gain buffer.

DETAILED DESCRIPTION OF THE INVENTION

The present invention is best understood in relation to FIGS. 1-9 of the drawings, like numerals being used for like elements of the various drawings.

Figure 1A:
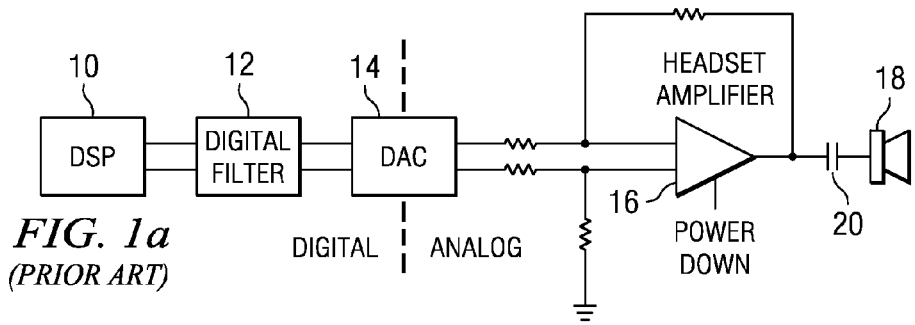
FIG. 1a illustrates a general diagram of a receiving (RX) voice channel in a headset amplifier.
Figure 1B:
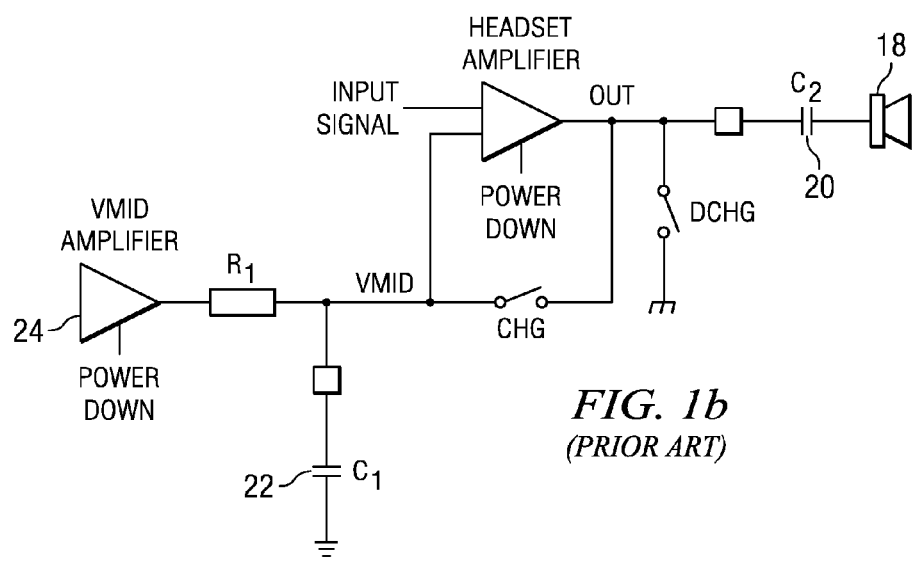
Figure 2:
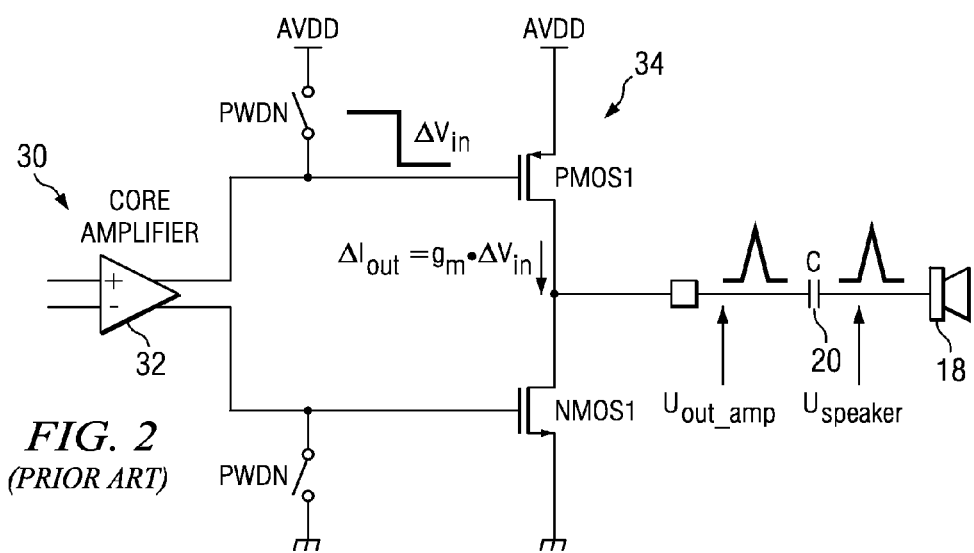
FIG. 2 illustrates a schematic representation of a typical voice, or audio output amplifier.

FIG. 2 illustrates a schematic representation of a typical voice or audio output amplifier 30. Amplifier 30 includes a core amplifier 32 and an output stage 34, which includes p-channel transistor PMOS1 and n-channel transistor NMOS1. PMOS1 and NMOS1 are driven by the outputs of core amplifier 32. The power-up and power-down phases are controlled by control signal PWDN, which implies a voltage step $\Delta V_{in}$ on the gate of the transistor PMOS1 (and on the gate of NMOS1, assuming that the voltage step $\Delta V_{in}$ has the same amplitude and opposite sign, on the NMOS side).

The following description of the operation of the amplifier 30 applies to both the PMOS1 and NMOS1 sides of the output stage 32; for simplicity, only the PMOS1 side is described in detail.

The output transistor PMOS1 works as a transconductance amplifier and generates $\Delta I_{out}$, which charges the AC coupling capacitor 20. Thus, we get:
$\Delta I_{out} = g_m \cdot \Delta V_{in}$, where $g_m$ is the transconductance of the transistor PMOS1 (respectively NMOS1).

Thus, $\Delta I_{out}$ charges the AC coupling capacitance c as follows:

$$U_{ot\_amp} = \frac{1}{C} \cdot \int \Delta I_{out} \cdot dt = \frac{g_m}{C} \cdot \int_o^t \Delta V_{in} \cdot dt$$

$$U_{out\_amp} = \frac{g_m}{C} \cdot \Delta V_{in} \cdot t$$

Figure 3:
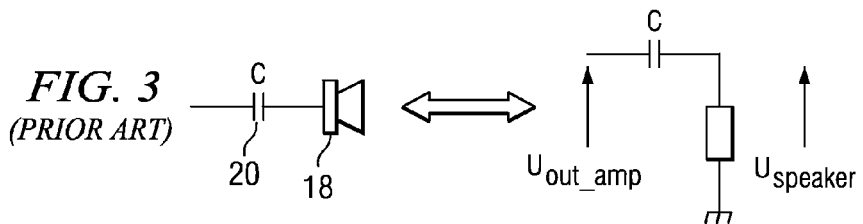
FIG. 3 illustrates an equivalent circuit for the speaker.

Consequently, a large variation in $\Delta I_{out}$ will cause a correspondent quick and large voltage step on $U_{out\_amp}$. The AC coupling capacitance in series with the speaker behaves as a derivative circuit, which is shown in FIG. 3. Thus, $$U_{speaker} = \frac{dU_{out\_amp}}{dt} = \frac{g_m}{C} \cdot \Delta V_{in}$$

The high-frequency voltage variation on $U_{speaker}$, due to the variation on $\Delta V_{in}$ causes the so-called "pop noise". Thus, pop noise is affected by three parameters: (1) the transconductance value of the output of the PMOS and NMOS transistors, (2) the value of the AC coupling capacitance, and (3) the voltage variation $\Delta V_{in}$ due to the power-on or power-off phase.

In the preferred embodiment described below, pop noise is prevented from occurring in the headset amplifier 30 during power-up and power-down, rather than filtering out the noise just prior to the speaker. During a power-up phase (as the power is being applied to the headset amplifier 30), $g_m$ is reduced during the critical phase. During a power-down phase (as power is removed from the headset amplifier 30), the slope of $\Delta V_{in}$ is reduced.

Figure 4:
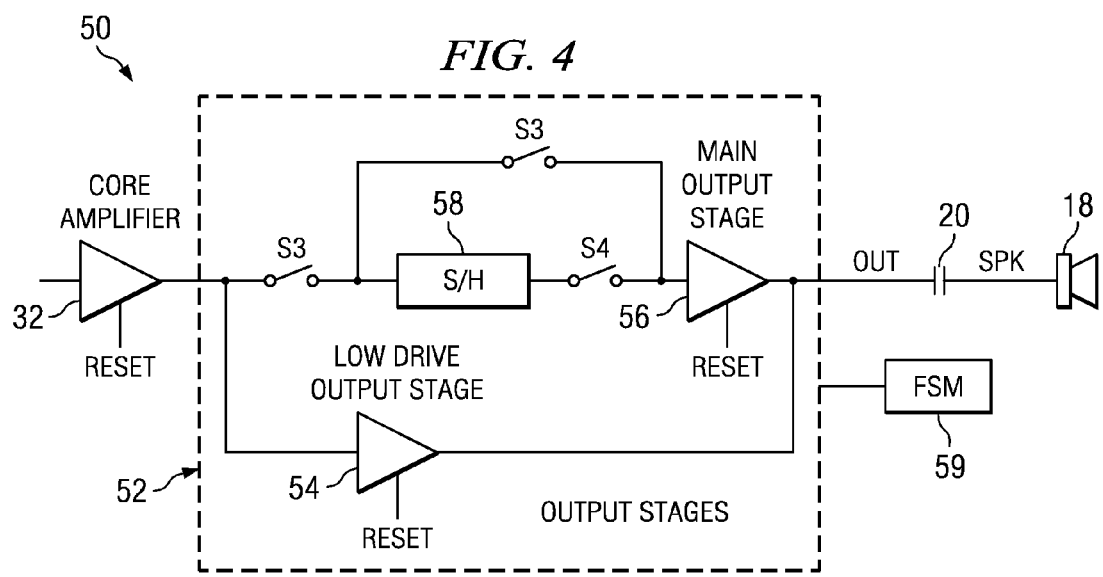
FIG. 4 illustrates a system view of a headset amplifier according to the preferred embodiment of the present invention.

FIG. 4 illustrates a basic block diagram of a headset amplifier 50. The output stage 52 includes a low drive output stage 54 and a main output stage 56 coupled between the output of core amplifier 32 and AC coupling capacitor 20. The main output stage 56 is applied responsive to switches S3. A sample and hold (S/H) circuit 58 is coupled to the output of core amplifier when switches S3 are closed (conducting current) and is coupled to the input of main output stage 56 when switch S4 is closed.

In operation, switches S3 and S4 are controlled by an on-chip finite state machine (FSM) 59. As used herein, a "switch" is circuitry that can be controlled to allow or inhibit current flow; typically, the switches are implemented using one or more MOS transistors having gate driving responsive to a control signal from the FSM 59. In the "reset" phase, the core amplifier is powered-down. In a "charge" phase, only the low drive output stage 54 is used to amplify the signal from the core amplifier 32. The low drive output stage 54 has low gain and low $g_m$. The low drive output stage 54 progressively charges the AC coupling capacitor 20. The third phase is the "voice communication" phase. Once the amplifier output reaches the $V_{OCM}$ (common mode voltage, typically equal to AVDD/2) value, the main output stage 56 is connected using switches S3 in order to provide the full gain performance for the voice or audio application. During this time, the sample-and-hold circuit 58 is charged to $V_{OCM}$. Once the voice or audio stops, and the power is removed from the circuit, the "discharge" phase begins. During the discharge phase the sample-and-hold circuit 58 drives the output of the main output stage (shown in greater detail in connection with FIGS. 8 and 9), which discharges the AC coupling capacitor 20 at a desired slope.

Accordingly, upon power-up, the split output stage 50 provides a low $g_m$ amplifier to drive the output to $V_{OCM}$, which eliminates the popping noise by keeping $\Delta I_{out} = g_m \cdot V_{in}$ low. Upon power-down, the sample-and-hold circuit 58 effectively keeps $\Delta V_{in} \approx 0$, as described in greater detail below.

Figure 5C:
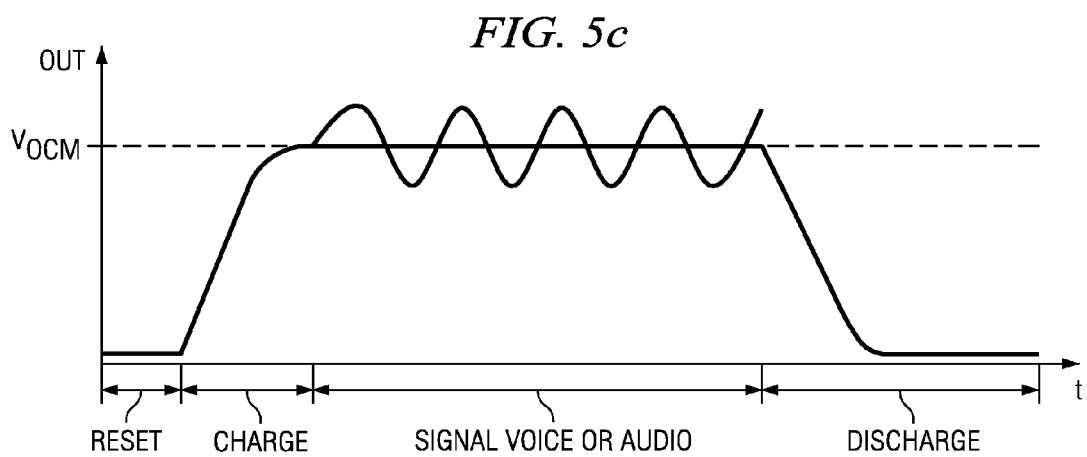
Figure 5A:
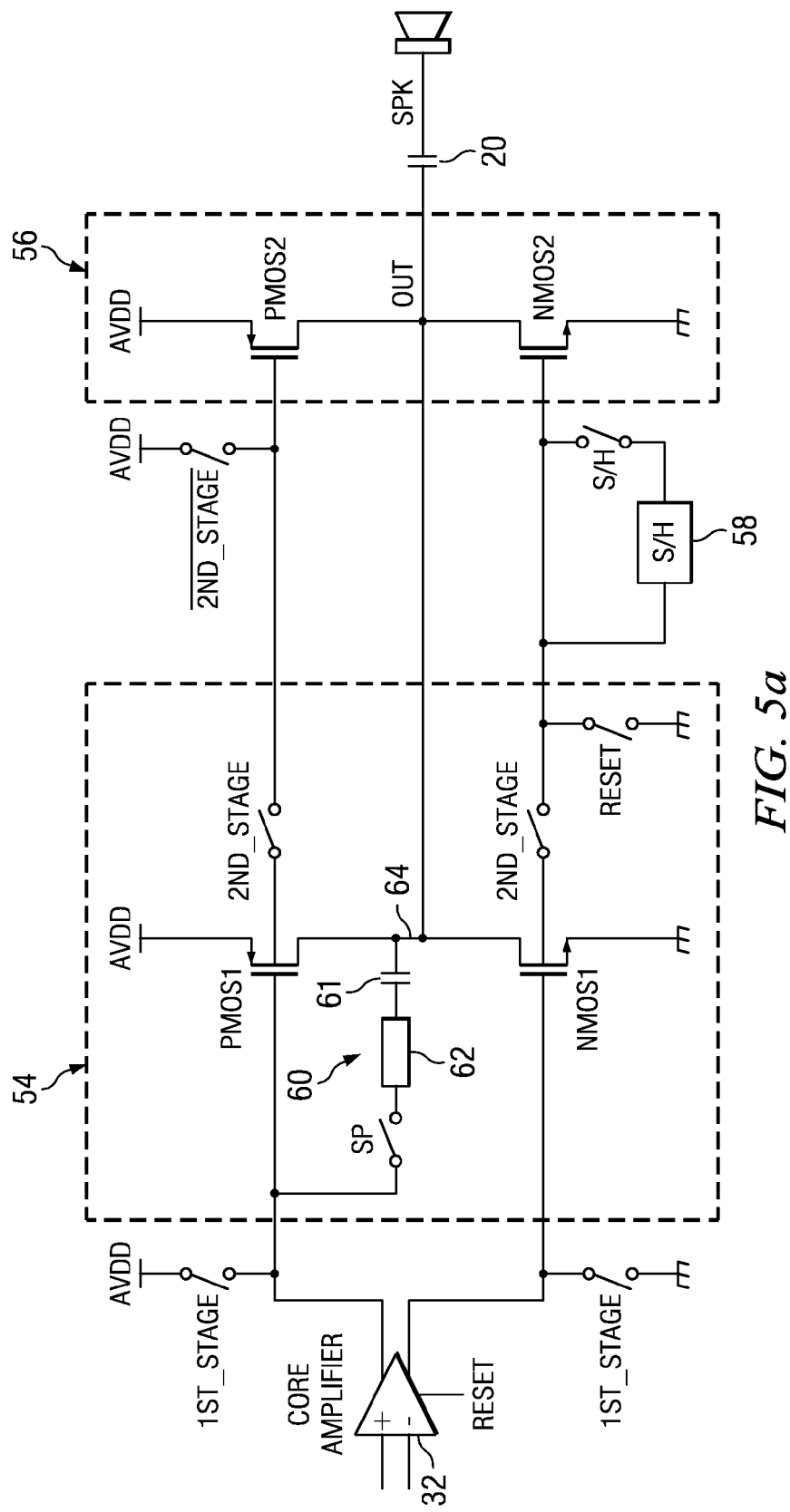
FIG. 5a illustrates a circuit view of a headset amplifier according to the preferred embodiment of the present invention.
Figure 5B:
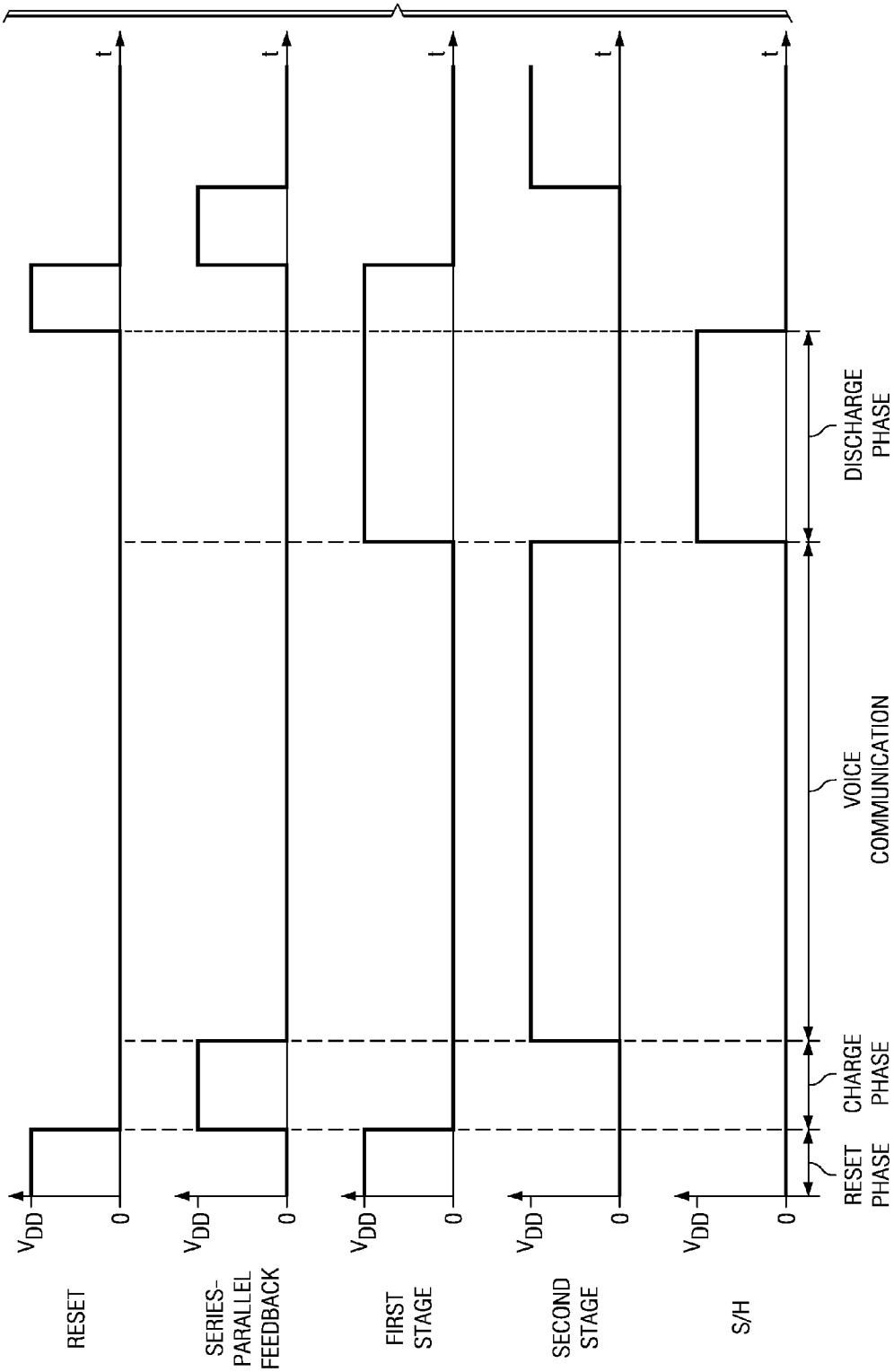

FIGS. 5a and 5b illustrate a schematic representation of the headset amplifier 50 and corresponding timing diagram, showing the low drive output stage 54 and main output stage 56 in greater detail. The low drive output stage 54 includes p-channel transistor PMOS1 and n-channel transistor NMOS1. PMOS1 has a first source/drain coupled to supply voltage AVDD and second source/drain coupled to a first source drain of NMOS1. The second source/drain of NMOS1 is coupled to ground. Preferably, a feedback circuit 60 including capacitor 61 and resistor 62 is coupled to the node 64 between PMOS1 and NMOS1 and the gate of PMOS1 through a switch controlled by signal SPF (series-parallel feedback). The gates of PMOS1 and NMOS1 are driven by the differential outputs of core amplifier 32. The gate of PMOS1 is selectively coupled to AVDD by a switch controlled by signal 1st_stage and the gate of NMOS2 is selectively coupled to ground by a switch controlled by signal 1st_stage. The main output stage 56 includes p-channel transistor PMOS2 and n-channel transistor NMOS2. PMOS2 has a first source/drain coupled to supply voltage AVDD and second source/drain coupled to a first source drain of NMOS2. The second source/drain of NMOS2 is coupled to ground. The gates of PMOS2 and NMOS2 are selectively driven by the outputs of core amplifier 30 as enabled by switches controlled by signal 2nd_stage. The gate of PMOS2 is selectively coupled to AVDD by a switch controlled by an inverted 2nd_stage signal. Node OUT is the output of the headset amplifier 50. OUT is coupled to the second source/drain of PMOS1, the second source/drain of PMOS2, the first source/drain of NMOS1 and the first source/drain of NMOS2. The gate of NMOS2 is selectively coupled to ground by a switch controlled by a Reset signal. Sample-and-hold circuit 58 has a sample input coupled to the gate of NMOS2 and a hold output selectively coupled to the gate of NMOS2 via a switch controlled by signal S/H.

FIG. 5b illustrates a timing diagram showing the operation of the switches of FIG. 5a in the reset phase, the Reset signal grounds the gate of NMOS2 to remove any charge on the gate. In the charge phase, the 1st_stage signal is enabled to charge OUT (and hence the AC coupling capacitor 20) to $V_{OCM}$ by the core amplifier 32. Also at the SPF signal, the feedback circuit 60 is enabled. The feedback circuit 60, when enabled, (1) reduces the gain of PMOS1 and (2) reduces residual spikes due to the direct connection of PMOS1 to the power down transistor (the transistor used as the 1st_stage switch coupling AVDD to the gate of PMOS1).

Once OUT reaches $V_{OCM}$, the main output stage 56 is coupled to the output of core amplifier 30 by control signal 2nd_stage. At this point, both the low drive output stage 54 and the main output stage 56 are amplifying the signal from the core amplifier 30 at node OUT.

FIG. 5c illustrates a graph of the voltage at the OUT node. After the reset period, the voltage gradually increases at OUT during the charge period until $V_{OCM}$ is reached. Thereafter, both the low drive output stage 54 and main output stage 56 are used to amplify the voice (or audio) signal. At the end of the voice signal, as power is removed from the amplifier 50, the sample-and-hold circuit 58 causes a gradual decrease in the voltage at OUT. Accordingly, no spikes are created at OUT, and no filtering is necessary.

FIG. 6 illustrates a circuit that can be used as the feedback circuit 60. Control signal SPF is coupled to the gate of NMOS transistor 70 and the inverted SPF signal is coupled to the gate of PMOS transistor 72. The OUT signal is coupled to a first terminal of capacitor 61 and the second terminal of capacitor 61 is coupled to first source/drains of the transistors 70 and 72. Second source/drains of transistors 70 and 72 are coupled to the gate of PMOS1.

In operation, transistors 70 and 72 act as a resistive switch under control of SPF. When SPF is high, feedback of the OUT signal to the gate of PMOS1 is enabled, thereby reducing the gain of PMOS1. Preferably, the transistors 70 and 72 have a small width and a long length to provide a high resistive switch.

FIG. 7 illustrates a resistive switch circuit that can be used for the 2nd_stage switch coupling PMOS2 to the output of the core amplifier 32 (the same circuit can also be used for selectively coupling NMOS2 to the output of the core amplifier 32). Control signal 2nd_stage is coupled to the gate of NMOS transistor 74 and the inverted 2nd_stage signal is coupled to the gate of PMOS transistor 76. The gate of PMOS2 is coupled to first source/drains of the transistors 74 and 76. Second source/drains of transistors 74 and 76 are coupled to an output of the core amplifier 32. Capacitor 78 is coupled across the source/drains of transistors 70 and 72.

The resistive switch circuit of FIG. 7 couples the PMOS2 transistor to the core amplifier 32 when 2nd_stage is at a logical high. The resistance provided by the transistors 74 and 76 reduces the charge injection effect. The capacitor 78 reduces the impedance for high frequencies and increases the phase margin moving away the second pole of the amplifier.

FIG. 8 illustrates a first embodiment for the sample-and-hold circuit 58. In this embodiment, an input operational amplifier 80, configured as a unity gain buffer, has an inverting input coupled to the gate of NMOS1 (and hence to the output of core amplifier 32) and a non-inverting input coupled to the output of the input operational amplifier 80. The output of the input operational amplifier 80 is selectively coupled to capacitor. $C_H$ and the non-inverting input of output operational amplifier 82 through switch S1. Output operational amplifier 82 also is configured as a unity gain buffer with its output coupled to its non-inverting input. The output of output operational amplifier 82 is selectively coupled to the gate of NMOS2 through switch S2 and resistor $R_L$. Capacitor $C_L$ represents the $C_{GS}$ of NMOS2.

In operation, during the charge and voice communication stages, the sample-and-hold circuit 58 is in sample mode. During this time, S1 is, closed, S2 is open and the hold capacitor, $C_H$, is charged to $V_{OCM}$ by the input operational amplifier 80.

At the end of the voice communication stage, the sample-and-hold circuit 58 is in hold mode. During this time, S1 is open, S2 is closed and the voltage across hold capacitor $C_H$ is applied to the gate of NMOS2 through the output operational amplifier 82, switch S2, and load resistor $R_L$. The hold capacitor $C_H$ thus keeps NMOS2 in a conducting state to discharge the AC coupling capacitor 20. Since the output operation amplifier 82 has a CMOS input stage, its input current is very low. This assures a low voltage drop rate during hold mode.

In the preferred embodiment, an adaptive biasing scheme is used to reduce power to the operational amplifiers 80 and 82. Each operational amplifier is biased with two bias sources, BiasH (high bias) and BiasL (low bias). When either operational amplifier is driving a capacitor (i.e., when the input operational amplifier is charging the hold capacitor $C_H$ or when the output operational amplifier is driving the load capacitor $C_L$), the core of the operational, amplifier 80 or 82 is biased with a high current (BiasH). Otherwise, when the operational amplifier is in an idle state, it is biased with a low current (BiasL). Thus, in sample mode, the input operational amplifier 80 is biased with BiasH and the output operational amplifier 82 is biased with BiasL. Similarly, in hold mode, the output operational amplifier 82 is biased with BiasH and the input operational amplifier 80 is biased with BiasL.

This approach significantly reduces the average power consumption of the sample-and-hold circuit 58. With typical bias currents of BiasH=60 μA and BiasL=10 μA, the average current consumption of the operational amplifiers is 35 μA. Further, since one operational amplifier will use a high bias while the other uses a low bias, the solution does not introduce any significant bump in the related power supply which could induce unwanted tones in the output of the headset amplifiers and therefore on the speaker.

The switch S2 and load resistor $R_L$ is preferably implemented as a resistive switch using a MOS transistor to save area. The value of the resistor is in the order of tens of kΩ. If the value of $R_L$ is too high, the RC time constant will be too high compared to the operation frequency of the sample-and-hold circuit and the hold voltage provided at the NMOS2 gate during the discharge phase will deviate from the sample voltage, causing a discontinuity on the gate voltage at the transition of the S/H signal (see FIG. 5b).

On the other hand, if $R_L$ is close to zero, the charge feed-through (toward the output stage of the headset amplifier) increases. In fact, the output resistor $R_L$ limits the charge injection in this direction since it increases the output impedance at high frequencies of the equivalent output load ($R_L$+ $1/sC_L$).

Accordingly, the characteristics of the discharge, through NMOS2 can be controlled by the values provided for $C_H$ and $R_L$. This allows the designer to effect the discharge within given time constraints while avoiding too fast a discharge or sampling errors, which would cause popping noises.

A second implementation for the charge-and-hold circuit 58, using a single operational amplifier 90, is shown in FIG. 9. In sample mode, sampling switches $S_S$ are closed and hold switches $S_H$ are open. In this mode, operational amplifier 90 is a unity gain buffer having its inverted input coupled to the output of core amplifier 32. Therefore, operational amplifier 90 drives capacitor $C_H$ to $V_{OCM}$. In hold mode, the hold switches $S_H$ are closed and the sample switches $S_S$ are open. Hence, in this mode, $C_H$ is coupled to the non-inverting input of operational amplifier 90. Operational amplifier 90 thus drives $C_L$ through $R_L$, thereby enabling NMOS2 to discharge the AC coupling capacitor 20.

The sample-and-hold circuit implementation of FIG. 9 functionally performs the same, as the implementation of FIG. 8; however the implementation of FIG. 9 uses only one operational amplifier, thus saving chip space and power.

The headset amplifier shown above provides significant advantages over the prior art. By providing a low-$g_m$ amplifier, spikes are avoided during the power-on phase. A series-parallel feedback is used in order to reduce the gain of the PMOS1 transistor during the charge phase and to reduce the residual spike due to the direct connection of the gate of the PMOS1 transistor to the power-down transistor (the transistor used as the 1st_stage switch). At power down, a sample-and-hold circuit keeps the $V_{GS}$ of the NMOS2 transistor constant to discharge the AC-coupling capacitor.

Although the Detailed Description of the invention has been directed to certain exemplary embodiments, various modifications of these, embodiments, as well as alternative embodiments, will be, suggested to those skilled in the art. The invention encompasses any modifications or alternative embodiments that fall within the scope of the Claims.

The invention claimed is:

1. Amplifier circuitry comprising:
   core amplifier circuitry having a first output and a second output;
   output stage circuitry, separate from the core amplifier circuitry, having a first input coupled to the first output, a second input coupled to the second output, and an amplified output;
   sample and hold circuitry, separate from the core amplifier circuitry and the output stage circuitry, having an input coupled to the second input and having an output; and
   switching circuitry having leads selectively coupling the output of the sample and hold circuitry to the second input of the output stage circuitry.

2. The amplifier circuitry of claim 1 including an AC coupling capacitor having one lead coupled to the amplified output and having a second lead, and a speaker having an input coupled to the second lead of the AC coupling capacitor.

3. The amplifier circuitry of claim 1 in which the output stage circuitry includes a PMOS transistor having a first source/drain coupled to a power supply lead, a second source/drain coupled to the amplifies output, and a gate coupled to the first input, and an NMOS transistor having a first source/drain coupled to the amplified output, a second source/drain coupled to a circuit ground, and a gate coupled to the second input.

4. The amplifier circuitry of claim 1 including switch circuitry selectively coupling a power supply lead to the first input.

5. The amplifier circuitry of claim 1 including switch circuitry selectively coupling the second input to circuit ground.

* * * * *